US008878521B2

(12) United States Patent
Juge et al.

(10) Patent No.: US 8,878,521 B2
(45) Date of Patent: Nov. 4, 2014

(54) CURRENT SENSOR CONSISTING OF A CABLE FOR ATTACHMENT IN THE FORM OF A LOOP

(75) Inventors: Patrice Juge, Marcellaz (FR); Jean-Luc Rayon, Montanay (FR)

(73) Assignee: Alstom Technology Ltd. (FR)

( * ) Notice: Subject to any disclaimer, the term of this patent is extended or adjusted under 35 U.S.C. 154(b) by 285 days.

(21) Appl. No.: 13/262,291

(22) PCT Filed: Mar. 30, 2010

(86) PCT No.: PCT/EP2010/054237
§ 371 (c)(1),
(2), (4) Date: Oct. 10, 2011

(87) PCT Pub. No.: WO2010/112523
PCT Pub. Date: Oct. 7, 2010

(65) Prior Publication Data
US 2012/0019233 A1  Jan. 26, 2012

(30) Foreign Application Priority Data
Mar. 30, 2009  (FR) ...................................... 09 51961

(51) Int. Cl.
*G01R 15/18* (2006.01)
(52) U.S. Cl.
CPC .................................... *G01R 15/181* (2013.01)
USPC ......................................... 324/127; 324/126
(58) Field of Classification Search
CPC .. G01R 15/183; G01R 15/185; G01R 15/181; G01R 15/202; G01R 15/205; G01R 15/246; G01R 19/0015; G01R 19/0092; G01R 19/15; G01R 19/165; G01R 19/257
See application file for complete search history.

(56) References Cited

U.S. PATENT DOCUMENTS

| 3,434,052 A | 3/1969 | Fechant |
| 4,584,525 A * | 4/1986 | Harnden et al. ............. 324/126 |
| 6,111,548 A * | 8/2000 | Braunlich et al. ............ 343/789 |
| 7,230,413 B2 * | 6/2007 | Zhang et al. ............. 324/117 R |
| 7,369,045 B2 * | 5/2008 | Hansen .................... 340/538.16 |
| 7,557,563 B2 * | 7/2009 | Gunn et al. .................... 324/127 |
| 2002/0050455 A1 * | 5/2002 | Kurokawa et al. ............ 204/431 |

FOREIGN PATENT DOCUMENTS

| EP | 0652441 | 5/1995 |
| EP | 2009453 | 12/2008 |
| WO | 99/54740 | 10/1999 |

* cited by examiner

*Primary Examiner* — Vinh Nguyen
(74) *Attorney, Agent, or Firm* — Baker Hostetler LLP

(57) ABSTRACT

A current sensor for measuring current through a conductor with the current sensor including a cable looped around the conductor to be monitored, and a transformer winding disposed in the cable for measuring current flow based on the Rogowski principle. The cable has opposite end portions coupled in an abutting relationship to form an endless loop with the winding flush with opposite end faces of the opposite and portions of the cable. The current sensor also has a coupling in the form of a sleeve including an assembly for attaching and detaching the opposite end positions of the cable having a stop ring which grips one of the end portions and a push button which is selectively movable against the stop ring for releasing the grip to open the opposite end portions. The cable may have a temperature sensor and a memory in which the measurement characteristics of the sensor are held. The sensor is reliable and accurate, and it can be left permanently in an electrical apparatus, or replaced, with no difficulty.

16 Claims, 4 Drawing Sheets

CURRENT SENSOR CONSISTING OF A CABLE FOR ATTACHMENT IN THE FORM OF A LOOP

This invention relates to a current sensor in the form of a cable that is looped around a conductor element that is to be monitored by the sensor; the invention further relates to electrical apparatus that is designed to receive said cable, or to which said cable can be applied.

Current sensors are used in power distribution equipment to identify certain kinds of fault, and in particular short circuits, by means of currents induced in the sensors by the current flowing in the element being monitored. The circuit breakers that are also present in the power distribution equipment open the power line so as to interrupt the current automatically when a short circuit occurs. Automatic re-closing of the power line is carried out a short time afterwards in order to re-establish the current as quickly as possible. However, that is of any value only if the fault that results from the short circuit was temporary and has disappeared. If the fault subsists, the circuit breaker must re-open the power line; but some types of equipment, such as gas insulated substations, may have been damaged by the re-closing operation. This is why it is desirable to use current sensors in order to verify that the fault has indeed disappeared before automatic re-closing takes place, and otherwise to prevent re-closing.

There are numerous current sensors that are not suitable for this application, because they become saturated over a portion of the measuring range, or because they do not have a proportional response, which makes them less able to monitor the high currents that are characteristic of short circuits. This applies in particular with sensors having a transformer with a magnetic core.

Among the current sensors that do not have this drawback, mention may be made of those sensors that are in the form of a cable for attachment in the form of a loop around the element to be monitored, and that include a winding arranged within the cable and serving as a transformer. These sensors are based on the measurement principle propounded by Rogowski, after whom such sensors are named at the present time. The known models for such sensors do however have some disadvantages: it is hard to form the loop with any accuracy and in a repeatable way, so that the measuring characteristics vary as a function of its diameter and the angle subtended by the transformer. This difficulty is found both in sensors having their ends stiffened by a tape that extends from one end to the other, so that they have overlapping portions, and in sensors having ends engaged in facing relationship inside a sleeve, since fitting is inaccurate and gives rise to not inconsiderable clearance between the ends of the cable, and this also makes measurement less accurate. Moreover, the way the sensor is fitted is liable to be altered over time, which gives rise to new causes of drift in the measurements and renders such sensors somewhat unsuitable for permanent installation in an apparatus.

The invention is directed to an improved sensor of the kind set forth above, which sensor is easy to install in a stationary position in electrical equipment such as a gas insulated substation or an outdoor bushing leading to an overhead power line, and is free of any measuring errors due to uncertainties as to looping or as to variations over time.

In a general form, the invention provides a current sensor consisting of a cable for attachment as a loop around a conductor element to be monitored by conjoining the two end portions of the cable, the cable including a sheath and a transformer winding arranged in the sheath, and the sensor further including a sleeve having a bore for receiving and conjoining the end portions of the cable, their sensor being characterized in that the conjunction sleeve contains an electronic calibration memory that contains calibration parameters for the sensor, and, in the bore, a closing and opening device comprising a deformable circular stop ring for selectively ensuring that the cable is held as a closed loop and enabling the loop to be opened in response to an external push button adapted to press on the stop ring, whereby to grip and then release one of the end portions of the cable, which is a movable end portion.

The ring, which is a non-return ring, situated inside the sleeve in front of at least one end portion of the cable (when it is inserted in the sleeve) enables this movable end portion of the cable to be retained in position, which guarantees that the sensor is kept closed during use, even for a long time, in spite of any influences to which it may be subjected.

Deliberate pressure on the external push button is able to exert a force on the non-return ring so as to open the sensor during a dismounting operation. A non-return device is provided for the stationary end portion of the cable.

In a preferred embodiment, the winding of the cable is flush with its ends, without any solid washer being interposed for closing off the ends that would prevent the winding from forming a complete circle. The ends are straight, without any portions in relief. In addition, the sleeve is hollow over its whole length with a bore of constant cross section that under all circumstances is without any abutment element. The winding is therefore formed into a complete circle by virtue of the abutment of the straight end portions, which is effected by simple manual pressure. Measurement is of better quality. Because there are no abutment elements inside the reception sleeve, there is nothing to prevent this abutment of the end portions taking place, and when the fitter feels the two end portions coming into contact as a result of the force being applied, the fitter knows that the sensor is then fully looped, without having to perform any other adjustment or any other check whatsoever.

Sealing rings situated on both sides of the sleeve and around the two end portions of the cable provide sealing for the sensor, which is necessary in numerous applications.

The body of the sleeve is made of a non-magnetic material, for example non-magnetic stainless steel or a plastics material, so as to avoid disturbing the measurement of current.

The sensor has the necessary flexibility and strength, for example by virtue of the sheath comprising an outer layer of polyurethane and an inner layer of either of polyurethane or of polyamide, the winding being embedded between the two said layers.

The inner layer of the sheath is thick enough to guarantee that the signal wire is held in a central position, which improves accuracy.

In two embodiments, the conductor of the winding is a wire that is insulated either with a sheath of plastics material or with a varnish.

In various improvements, the sensor may include a temperature sensor or a calibrating device, these various additional means being disposed in a branch of the sleeve that is provided for external connection in a perpendicular direction to two main branches of the sleeve that receive the end portions of the cable. The temperature sensor assists in making the calibration adjustments of the sensors, and the calibrating device contains the information that characterizes the measurement taken by the sensor, to enable the signals that the sensor receives to be immediately converted (at a given temperature) into values of current flowing along the conductor being monitored.

The invention is described below with reference to the following figures:

FIG. 2 is a general view, FIG. 3 shows the conjunction of the ends of the cable, and FIG. 4 is a view of the electrical connection.

Figure 1:
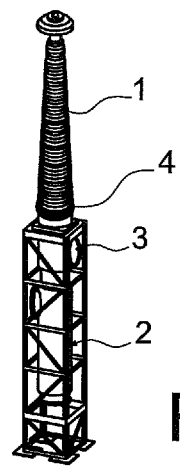
FIG. 1 represents one example of the use of the invention.

FIG. 1 shows a power transmission apparatus comprising an outdoor bushing 1, above which there is an overhead power line. A screened cable 2 extends downwards below the bushing 1; it is provided with a circuit breaker 3 and other apparatuses in the known way. A current sensor 4 in accordance with the invention is shown at the base of the overhead bushing 1, but it could be used in other locations, and in particular around the circuit breaker 3.

Figure 2:
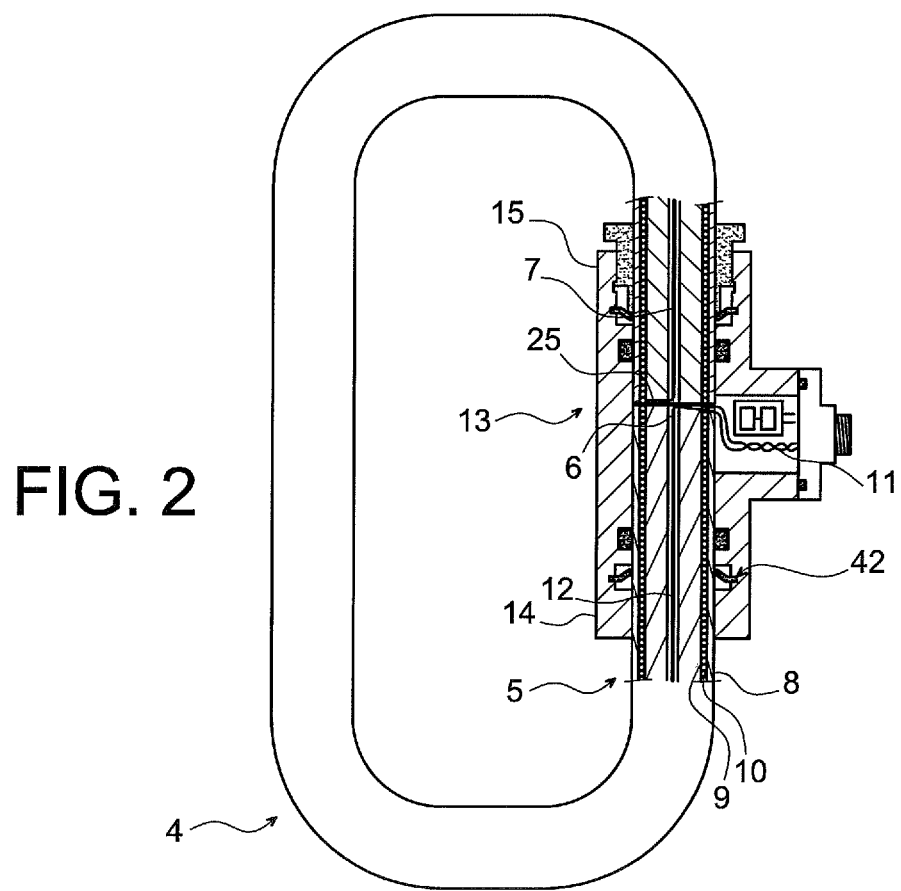
FIGS. 2, 3 and 4 are three views of the current sensor.
Figure 3:
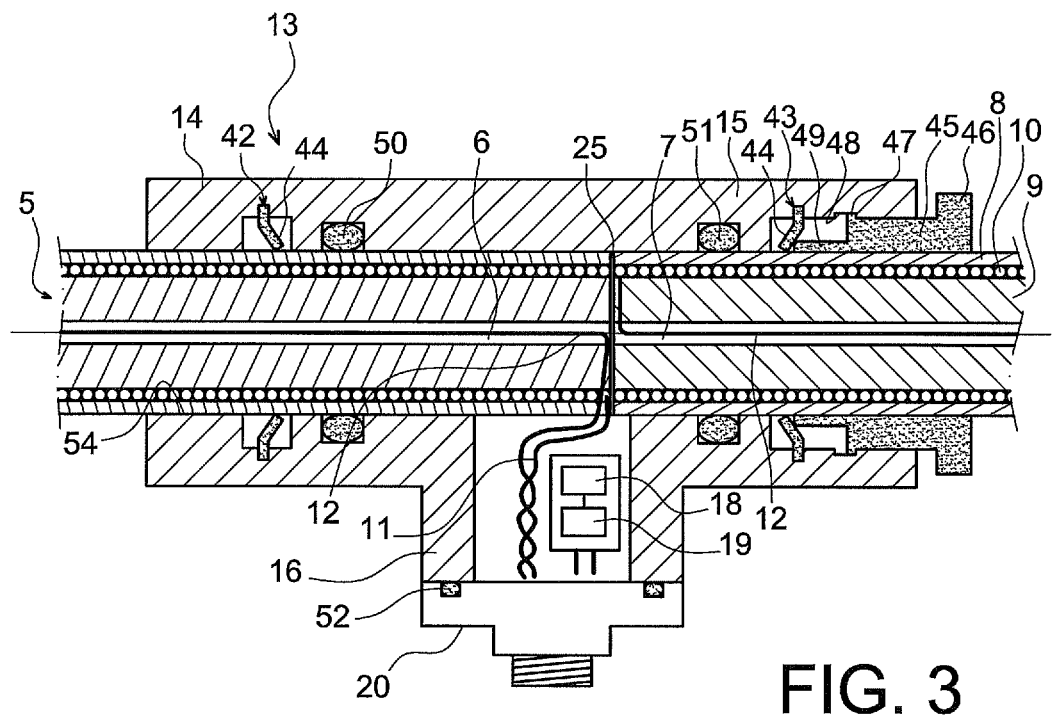
Figure 4:
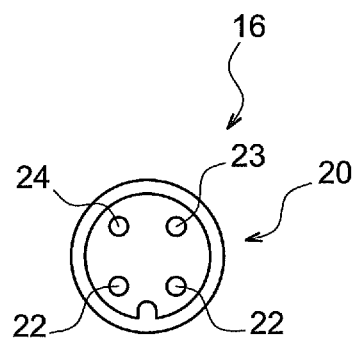

The current sensor consists of a cable 5 (see FIGS. 2 and 3) that is able to be formed into a loop with its end portions abutted against each other. The cable 5 has an outer layer 8 of a sheath that may be made of flexible polyurethane having an external diameter of 14 mm, together with an inner layer 9 of the sheath, which is concentric with the outer layer 8 and is made of polyurethane or polyamide. A winding 10, the conductor of which is a wire that may be insulated either with a plastics sheath or with a varnish, is embedded between the two layers of the sheath and extends over the whole length of the cable 5 from one end 6 of the cable to its other end 7. The winding 10 is terminated by an input wire 11 that passes out of the cable 5 and by an output wire 12 that extends into the inside of the inner layer 9 from the end portion 7 to the other end portion 6, before itself also passing out of the cable 5. The inner layer 9 of the sheath may advantageously be quite thick so as not to transmit any substantial movements of the output wire 12, and so as to hold it in the center of the cable 5. The sensor 4 further includes a coupling in the form of a sleeve 13, which comprises: a first branch 14 for containing, fastened within it, the end portion 6; a second branch 15 for receiving the other end portion 7, in such a way that the end portion 7 is able to be moved and extracted completely; and a third branch 16, disposed at a right angle to the branches 14 and 15, the input wire 11 and output wire 12 being received in this third branch.

The third branch 16 further includes a temperature sensor 18 and a calibration device 19 comprising a memory that contains the calibration parameters for the sensor 4 and its serial number, which serve to correlate the current induced in the winding 10 by a current flowing in the conductor around which the sensor is looped, with the inducing current, the above mentioned parameters and serial number having been obtained beforehand by appropriate calibration. The third branch 16 terminates on a terminal contact member 20 that has connections 22 to the input wire 11, 23, to the output wire 12, and 24 to the devices 18 and 19. A control unit (designated 41 in some other figures), connected to the branch 20, receives the current that flows through the winding 10 and controls the devices 18 and 19. It may also inject small quantities of current into the cable 5 in order to verify its continuity periodically. Because the amplitude of the output signal from the sensor is small, perhaps a few tens of millivolts per kiloamp, the control unit is preferably located close by, that is to say no more than a few meters away. In addition, the linking cable has an external screen for protecting the signal against electromagnetic disturbances; while the two pairs of wires that it contains, leading to the connections 21 to 24, are twisted together individually. The control unit amplifies and processes the output signal from the sensor as required. It also governs correction of this signal as a function of the parameters from the temperature transducer 18 and the calibration parameters of the device 19.

In the invention, the sleeve 13 has a through bore 54 that extends right through its first branch 14 and its second branch 15; the end portions 6 and 7 of the cable 5 are open, that is to say they have no end pieces; and the winding 10 is flush with the end surfaces 25, which are straight (i.e. flat, or without any portions in relief), so that the ends of the cable can be abutted together somewhere inside the bore 54, when the end portion 7 is pushed into the second branch 15 sufficiently hard. The coupling 13, having a bore 54 that extends right through it in the first branch 14 and the second branch 15, and that is perfectly cylindrical, enables the contact between the end portions 6 and 7 to be made. The winding 10 accordingly extends over an almost continuous circumference, which ensures accurate measurement. Since bringing the cable 5 into this abutting contact is the only adjustment needed, it is easy to ensure reliable fitting. No verification is necessary and nor is any re-calibration. The cable is quite flexible, so it can be bent into the aperture 35 and introduced into the groove 32 from outside; in addition, the aperture 35 is quite wide at its inner side so as to facilitate the introduction of the sleeve 13 and the closing of the loop of the cable 5 too.

Other important features are that the sleeve 13 is provided with two stop rings 42 and 43 for blocking linear movement of the cable 5, these rings being in the first branch 14 and the second branch 15, in which they are retained in the grooves. Each of the stop rings 42 and 43 has a free conical portion 44 that rubs on the outer sheath layer 8 of the end portions 6 and 7, the portions 44 being oriented towards each other so that the introduction of the end portions 6 and 7 into the sleeve 13 is made easy because of an elastic deformation of the conical portion 44, though extraction of the end portions is hindered because the conical portions jam them in place. The cable 5 is thereby held in its closed position under all circumstances, except when a push button 45, which is mounted in the second branch 15, is operated. This push button consists of an outer portion 46 that lies outside the sleeve 13 and serves as a finger pad; a bead 47 that is movable in a groove 48 formed in the sleeve 13 with a finite length; and a nose portion 49 that extends towards the conical portion 44 of the stop ring 43. When the outer portion 46 is pushed, the push button 45 is moved inwards so that its nose portion 49 exerts a thrust on the conical portion of the stop ring so as to deform this conical portion elastically and release it from the cable end portion 7, which is then able to be withdrawn so that the loop of the cable 5 can be opened. In the normal position shown in FIG. 3, the push button 45 is always separated from the stop ring 43. The length and position of the groove 48 are chosen so as to ensure these two states. The first branch 14 of the sleeve 13 may be without a push button, the cable end portion 6 then being lodged permanently in this branch. The sleeve 13 further includes two circular sealing rings 50 and 51 in two further grooves in the branches 14 and 15, for bearing grippingly on the end portions 6 and 7 of the cable 5 and for sealing the joint of the two ends; the third branch 16 is itself insulated by a third seal 52 that is compressed against the branch by the terminal contact member 20.

Figure 5:
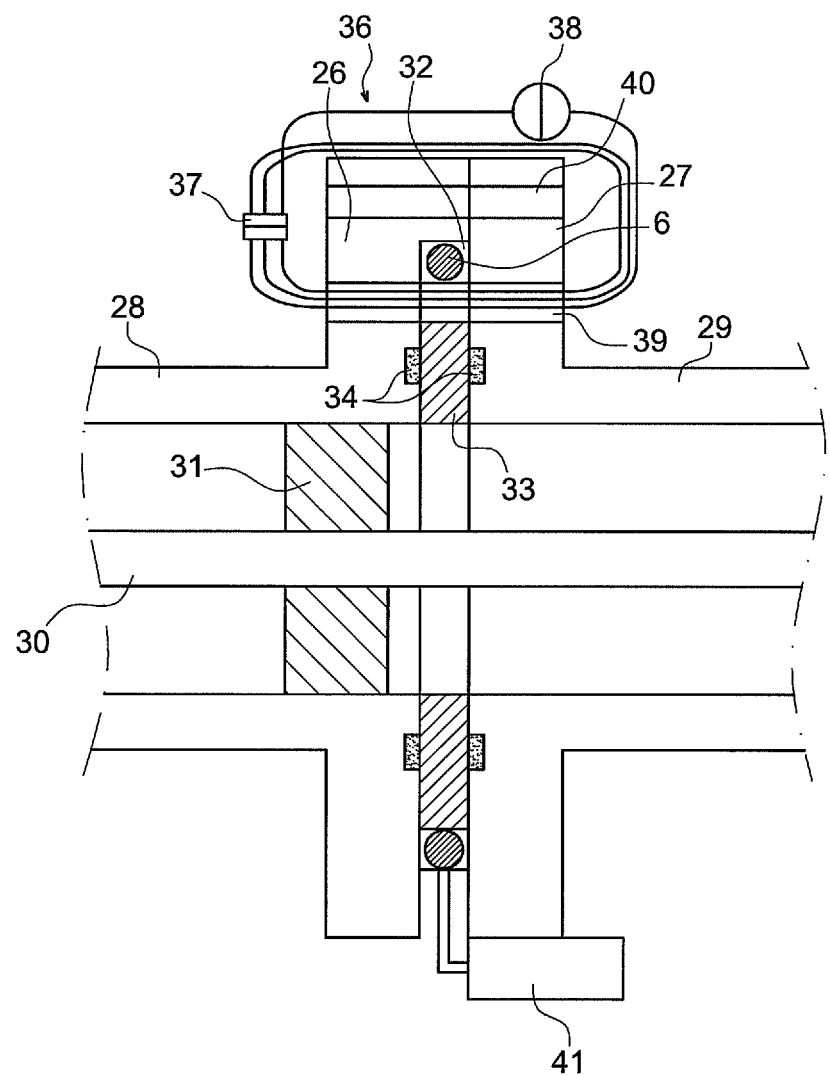
FIGS. 5 and 6 are two views (in axial section and in diametral section, respectively) showing an apparatus in which the sensor is received.
Figure 6:
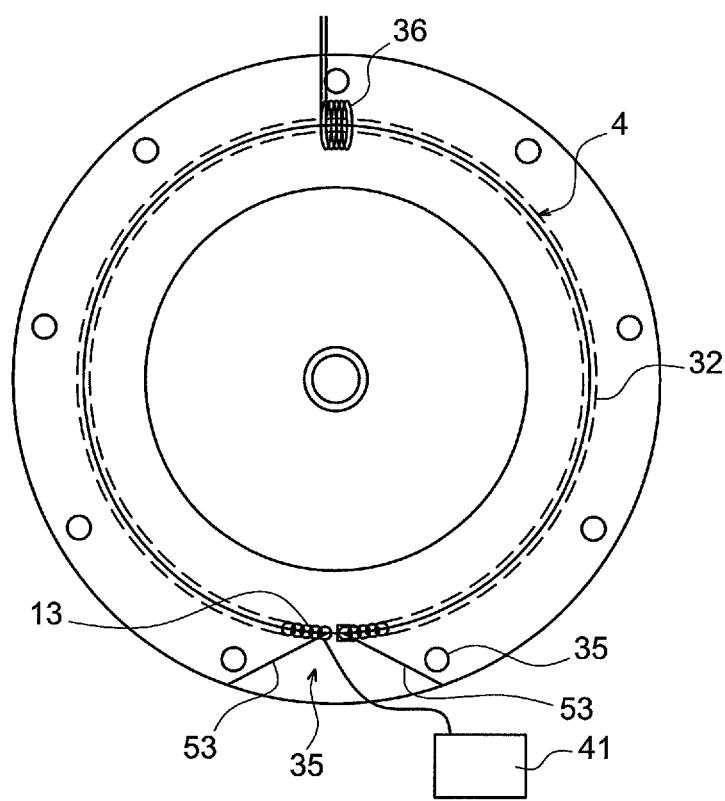

FIGS. 5 and 6 show the use of the sensor 4 with a gas insulated screened cable. There, the sensor 4 is disposed between the joint flanges 26 and 27 of the sheath portions 28 and 29 of the electric cable 30 to be monitored, which extends through the center of the sheath portions 28 and 29 and is supported by insulators 31. The sensor 4 is arranged in an endless circular groove 32 formed in one of the flanges, 26, around an insulating radial plate 33 having gas-tight seals 34. The control unit 41 for the sensor 4 is shown as being fastened to the other flange 25. It is of advantage that bolt holes 40 surround the groove 32 so that these holes do not affect measurements.

The essential element of this embodiment is that the groove 32 shall be in communication with the outside only through a fan-shaped aperture 35, through which the sensor 4 is able to be introduced, starting with the cable end portion 6. The cable 5 accordingly progresses into the groove 32 by winding itself little by little so as to form a loop naturally when the coupling 13 has been fitted into the groove 32. For this purpose, the edges 53 of the aperture 35 are quite close to the tangent with the groove 32, and the cable 5 is quite flexible, so that it is able to be bent into the aperture 35 and introduced from outside into the groove 32; and the aperture 35 is large enough at its inside end to make it easy to introduce the sleeve 13 and close the loop of the cable 5. This arrangement makes it possible to avoid dismantling the sheath of the cable 30 when it is necessary to carry out any work on the sensor 4.

Another arrangement involves an independent test winding 36, which can be used for testing the sensor 4 by injecting of a current that augments the primary current. This test winding 36, which is not very intrusive, does not require any dismounting. It may be an open cable that can be looped with a joint 37, and may consist of a certain number of turns, being supplied with power by a current generator 38. It passes through a hole 39 formed through the flanges 26 and 27 between the radial plate 33 and the sensor 4. The other side passes outside the flanges 26 and 27 so as to surround a section of the sensor 4.

The invention claimed is:

1. A current sensor for measuring current flowing through a conductor comprising: a cable having opposing end portions adapted to be held in an abutting relationship such that the cable forms an endless loop surrounding the conductor, a sheath having at least two layers, a transformer winding disposed between the layers of said sheath and a coupling in the form of a sleeve having a through bore within which the opposing end portions of the cable are detachably connected to one another,
   wherein the sleeve further comprises a stop ring which grips one of the end portions of the cable for holding the opposing ends of the cable in abutment attached to one another and a push button extending outside the sleeve with the push button being selectively movable into a position against the stop ring for releasing the grip of said stop ring such that the opposing end portions of the cable are detached from one another.

2. The current sensor according to claim 1 wherein the stop ring comprises a conical portion bearing grippingly on one of the end portions of the cable.

3. The current sensor according to claim 2 wherein the push button and stop ring extend around said one of the end portions of the cable, with the push button further comprising a nose portion for exerting a thrust on the conical portion of the stop ring when said push button is being moved.

4. The current sensor according to claim 1, including a second deformable stop ring arranged in the bore of the sleeve for gripping the other end portion of the cable.

5. The current sensor according to claim 1, wherein the through bore extends throughout the length of the sleeve and the transformer winding is flush with the end portions of the cable so that the end portions of the cable are abutable within the sleeve and the winding being continuous the length of the cable.

6. The current sensor according to claim 1, wherein the sleeve further comprises sealing rings located about the end portions of the cable.

7. The current sensor according to claim 1, wherein the sheath comprises an outer layer of polyurethane and an inner layer of either polyurethane or polyamide, and the winding is embedded between the layers.

8. The current sensor according to claim 1, further comprising an electronic calibration memory that contains calibration parameters of the sensor.

9. The current sensor according to claim 8, further comprising a temperature sensor.

10. The current sensor according to claim 9, wherein the electronic calibration memory and the temperature sensor are disposed to in a branch of the sleeve, the branch extending perpendicular to the sleeve and containing electrical connections of the transformer winding to an external control unit.

11. Electrical apparatus comprising the current sensor of claim 1 and a groove in which the current sensor is contained.

12. The electrical apparatus according to claim 11 wherein the groove opens outside the apparatus at an opening that flares outwardly in a circumferential direction of the groove.

13. The electrical apparatus according to claim 11 further comprising a test winding for testing the flow of current in said current sensor with the test winding arranged around a portion of the groove and partly in a hole of the apparatus such that a current generated in the test winding will induce current in said current sensor to enable said current sensor to be checked and calibrated.

14. Electrical apparatus in an arrangement comprising the current sensor of claim 1 and a gas-insulated screened cable comprising an electrical cable, a sheath insulating and surrounding the cable with the current sensor arranged around said sheath.

15. Electrical apparatus in an arrangement comprising the current sensor of claim 1 and a power transmission apparatus comprising an outdoor bushing and a cable with the current sensor arranged at a base of the outdoor bushing.

16. Electrical apparatus in an arrangement comprising the current of claim 1 and a power transmission apparatus comprising an outdoor bushing and a cable with the current sensor arranged around a circuit breaker provided on the cable.

* * * * *